US008780341B2

(12) United States Patent
Wu

(10) Patent No.: US 8,780,341 B2
(45) Date of Patent: Jul. 15, 2014

(54) INSPECTING SYSTEM FOR LENS MODULE

(71) Applicant: Cheng-Shiun Wu, New Taipei (TW)

(72) Inventor: Cheng-Shiun Wu, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/663,580

(22) Filed: Oct. 30, 2012

(65) Prior Publication Data

US 2013/0148110 A1 Jun. 13, 2013

(30) Foreign Application Priority Data

Dec. 7, 2011 (TW) ............................ 100145151 A

(51) Int. Cl.
*G01B 9/00* (2006.01)
*G03F 7/20* (2006.01)
*G01M 11/02* (2006.01)

(52) U.S. Cl.
CPC ........... *G03F 7/706* (2013.01); *G01M 11/0235* (2013.01)
USPC ............ 356/124; 250/548; 250/557; 700/264

(58) Field of Classification Search
CPC ....................................................... G03F 7/706
USPC .................... 356/124; 250/548, 557; 700/264
See application file for complete search history.

(56) References Cited

U.S. PATENT DOCUMENTS

| | | | | |
|---|---|---|---|---|
| 5,015,866 | A * | 5/1991 | Hayashi | 250/548 |
| 8,279,426 | B2 * | 10/2012 | Lin | 356/124 |
| 2007/0279619 | A1 * | 12/2007 | Chang | 356/124 |
| 2008/0123087 | A1 * | 5/2008 | Chen | 356/124 |
| 2010/0039270 | A1 * | 2/2010 | Lin | 340/600 |
| 2010/0063630 | A1 * | 3/2010 | Sutherland et al. | 700/264 |

FOREIGN PATENT DOCUMENTS

| | | | |
|---|---|---|---|
| TW | 200721356 | A | 6/2007 |
| TW | 200801476 | A | 1/2008 |
| TW | 200823445 | A | 6/2008 |
| TW | 201009412 | A | 3/2010 |

* cited by examiner

*Primary Examiner* — Tarifur Chowdhury
*Assistant Examiner* — MD Rahman
(74) *Attorney, Agent, or Firm* — Novak Druce Connolly Bove + Quigg LLP

(57) ABSTRACT

An inspecting system for inspecting a lens module includes an inspection device; and a transmitting and loading device. The transmitting and loading device includes a grasping assembly, a supporting assembly, a sliding assembly loaded on the supporting assembly, and a control unit for controlling the grasping assembly and the sliding assembly. The grasping assembly is configured to clamp the lens module and to load the lens module on the sliding assembly, and the sliding assembly is adapted to transfer the lens module to a testing position of the inspection device.

10 Claims, 2 Drawing Sheets

100 314 38 318 5048 14 10 12 50 502 5024 5022 39 31 316 362 36 34 312 32 30 control unit 506 5046 5044 5042 503 504

INSPECTING SYSTEM FOR LENS MODULE

BACKGROUND

1. Technical Field

The present disclosure relates to inspecting systems, particularly to an inspecting system for lens module.

2. Description of Related Art

A lens module typically includes two lenses. The imaging quality of each of the two lenses of the lens module needs to be inspected by an inspecting system. The lens module for inspection needs to be transferred and loaded on a testing position of the inspecting system by an operator. The imaging quality of each of the two lenses is to be investigated by adjusting the distance between each of the two lenses of the lens module. A pattern is to be imaged and investigated to obtain the modulation transfer function of each of the two lenses. After one of the two lenses of the lens module has been inspected, the lens module is rotated 180° by the operator to inspect another one of the two lenses of the lens module. However, because the lens module is transferred or loaded by the operator in the process of inspecting the lens module, the inspecting efficiency of the lens module is low, and the lens module may be contaminated during the inspecting process.

Therefore, there is room for improvement in the art.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the inspecting system for lens module. Moreover, in the drawings, like reference numerals designate corresponding parts throughout the several views. Wherever possible, the same reference numerals are used throughout the drawings to refer to the same or like elements of an embodiment.

DETAILED DESCRIPTION

Figure 1:
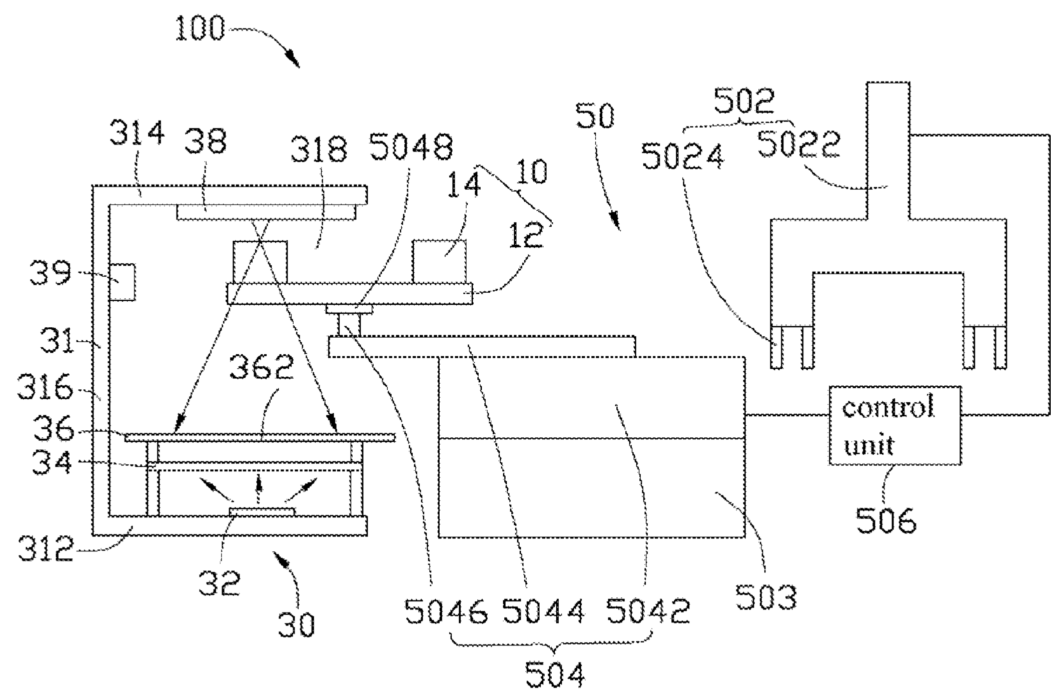
FIG. 1 is a side view of a first embodiment of an inspecting system for a lens module.

A first embodiment of an inspecting system 100 is shown in FIG. 1. The inspecting system 100 is used for inspecting the imaging quality of a lens module 10. The lens module 10 includes a base board 12 and two lenses 14 fixed on the base board 12 adjacent to opposite ends of the base board 12. In the illustrated embodiment, the base board 12 is substantially flat, and the two lenses 14 are fixed to the same surface of the base board 12.

The inspecting system 100 includes an inspection device 30 and a transmitting and loading device 50 for transmitting the lens modules 10. The inspection device 30 includes a housing 31, a light source 32, a diffusion plate 34, a testing board 36, and an image sensor 38. The housing 31 includes a bottom board 312, a top board 314 parallel to the bottom board 312, and a sidewall 316 interconnecting the ends of the bottom board 312 and the top board 314. The bottom board 312, the top board 314, and the sidewall 316 cooperatively form a receiving space with an opening 318. In the illustrated embodiment, the light source 32, the diffusion plate 34, the testing board 36, and the image sensor 38 are successively received in the housing 31.

The light source 32 is positioned on the bottom board 312, the diffusion plate 34 is disposed above the light source 32, and the testing board 36 is disposed above the diffusion plate 34. The image sensor 38 is fixed to an inner surface of the top board 314 facing the testing board 36. The diffusion plate 34 is a light guide plate made of organic glass. The testing board 36 forms a pattern 362 at about the center portion of the testing board 36. The light transmitted by the light source 32 is turn into a surface light source from a point light source by the diffusion plate 34 and irradiates on the pattern 362 of the testing board 36. The image sensor 38 is used to sense the image formed by the pattern 362 passing through each of the two lenses 14 of the lens module 10 to be inspected. In the illustrated embodiment, the imaging quality of each of the two lenses 14 is to be investigated by adjusting the distance between each of the two lenses 14 and the pattern 362 and investigating the modulation transfer function of each of the two lenses 14.

The inspection device 30 further includes a position sensor 39 fastened to the inner surface of the sidewall 31. In the illustrated embodiment, the position sensor 39 is a laser inspector, and is used for inspecting whether each of the two lenses 14 to be inspected is in a testing position. The position sensor 39 is fixed to the sidewall at a same level with the testing position.

The transmitting and loading device 50 includes a grasping assembly 502, a supporting assembly 503, a sliding assembly 504 loaded on the supporting assembly 503, and a control unit 506 for controlling the grasping assembly 502 and the sliding assembly 504. In the illustrated embodiment, the grasping assembly 502 of the transmitting and loading device 50 is a robot with a mechanical arm having a clamping mechanism.

The grasping assembly 502 is used to clamp one of the lens module 10 and load the lens module 10 on the sliding assembly 504. The lens module 10 is transferred to the testing position by the sliding assembly 504. The grasping assembly 502 includes a mechanical arm 5022 electrically connected to the control unit 506 and two grasping claws 5024 formed at an end of the mechanical arm 5022. The control unit 506 is capable of controlling the mechanical arm 5022 to move to clamp two of the lens modules 10. In the illustrated embodiment, each of the two grasping claws 5024 is made of polyetheretherketone (PEK). The PEK has a high melting point for high temperature resistance, relatively excellent wear resistance, and relatively excellent mechanical property, especially proper hardness to firmly grasp the lens module 10 without damage.

The sliding assembly 504 includes a sliding guide 5042, a sliding member 5044 slidably disposed on the sliding guide 5042, and a rotating shaft 5046 rotatably connected to an end of the sliding member 5044 away from the sliding guide 5042, adjacent to the inspection device 30. The rotating shaft 5046 forms a mounting portion 5048 at a distal end thereof away from the sliding guide 5042.

In use, the control unit 506 controls the sliding assembly 504 to slide on one end of the sliding guide 5042 adjacent to the grasping assembly 502, the mechanical arm 5022 drives the grasping claws 5024 to grasp the lens modules 10 and load the lens modules 10 on the mounting portion 5048 of the rotating shaft 5046. In the illustrated embodiment, the two lenses 14 of the lens module 10 are symmetrical with the rotating shaft 5046. The sliding assembly 504 slides on the other end of the sliding guide 5042 away from the grasping assembly 502. At this time, one of the two lenses 14 is loaded above the pattern 362 and on the testing position of the inspection device 30. The inspection device 30 inspects each of the two lenses 14 loaded on testing position when the position sensor 39 senses each of the two lenses 14 loaded on the testing position of the inspection device 30. After one of the two lenses 14 of the lens module 10 has been inspected, the control unit 506 controls the rotating shaft 5046 to rotate 180°, and the inspecting device 30 can inspect the other one of the two lenses 14 of the lens module 10.

After the two lenses 14 of the lens module 10 have been inspected, the control unit 506 controls the sliding assembly 504 to slide on the end of the sliding guide 5042 adjacent to the grasping assembly 502. The grasping assembly 502 unloads the lens module 10 having been inspected and loads another one of the lens module 10 on the mounting portion 5048 of the rotating shaft 5046, which can achieve continuous test of the lens module 10.

Figure 2:
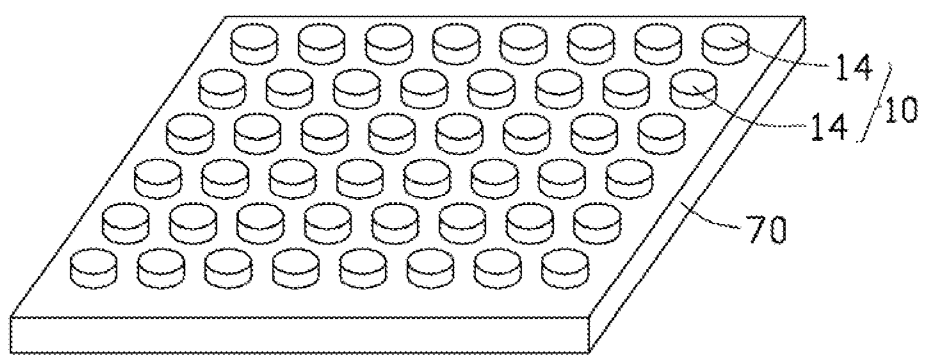
FIG. 2 is an isometric view of a testing tray loaded with lenses of a second embodiment of an inspecting system for the lens module.

Referring to FIG. 2, a second embodiment of the inspecting system 100 is similar to the first embodiment of the inspecting system 100, except that the second embodiment of the inspecting system 100 includes a testing tray 70 for holding a plurality of the lens modules 10. In testing, the plurality of lens modules 10 are loaded in the testing tray 70 in a matrix-like manner, and the testing tray 70 is loaded at the mounting portion 5048 of the rotating shaft 5046. The control unit 506 controls the horizontal movement of the rotating shaft 5046 to satisfy the continuous test of the lens modules 10.

It is believed that the present embodiments and their advantages will be understood from the foregoing description, and it will be apparent that various changes may be made thereto without departing from the spirit and scope of the embodiments or sacrificing all of its material advantages.

What is claimed is:

1. An inspecting system for inspecting a lens module, comprising:

an inspection device; and a transmitting and loading device comprising a grasping assembly, a supporting assembly, a sliding assembly loaded on the supporting assembly, and a control unit for controlling the grasping assembly and the sliding assembly, wherein the grasping assembly is configured to clamp the lens module and to load the lens module on the sliding assembly, and the sliding assembly is located between the grasping assembly and the inspection device to transfer the lens module from out of the inspection device to a testing position of the inspection device.

2. The inspecting system of claim 1, wherein the inspection device comprises a housing, a light source, a diffusion plate, a testing board, and an image sensor; the light source, the diffusion plate, the testing board, and the image sensor are received in the housing, the testing board forms a pattern near the center portion of the testing board, the diffusion plate is configured to transmit a light beam emitted by the light source into a surface light source, and the image sensor is adapted to sense an image formed by the pattern passing through a lens of the lens module to be inspected.

3. The inspecting system of claim 2, wherein the inspection device further comprises a position sensor fixed to a sidewall of the housing at a same level as the testing position, the position sensor is adapted to inspect if the lens of the lens module is in the testing position.

4. The inspecting system of claim 3, wherein the position sensor is a laser inspector.

5. The inspecting system of claim 1, wherein the grasping assembly comprises a mechanical arm electrically connected to the control unit and two grasping claws formed at an end of the mechanical arm.

6. The inspecting system of claim 5, wherein each of the two grasping claws is made of polyetheretherketone.

7. The inspecting system of claim 1, wherein the sliding assembly comprises a sliding guide, a sliding member loaded on the sliding guide, and a rotating shaft connected to an end of the sliding member away from the sliding guide, adjacent to the inspection device; the sliding member slides on the sliding guide, and the rotating shaft is rotatable.

8. The inspecting system of claim 7, wherein the rotating shaft forms a mounting portion at a distal end of the rotating shaft, away from the sliding guide.

9. The inspecting system of claim 8, wherein the transmitting and loading device is adapted to load the lens module on the mounting portion of the rotating shaft so that lenses of the lens module are symmetrically placed with respect to the rotating shaft.

10. The inspecting system of claim 8, further comprises a testing tray disposed on the mounting portion of the rotating shaft, the testing tray is configured to hold a plurality of the lens modules in matrix manner.

* * * * *